(12) United States Patent
Hedge et al.

(10) Patent No.: US 6,716,322 B1
(45) Date of Patent: Apr. 6, 2004

(54) METHOD AND APPARATUS FOR CONTROLLING FILM PROFILES ON TOPOGRAPHIC FEATURES

(75) Inventors: Hari Hedge, Little Neck, NY (US); Alan V. Hayes, Centerport, NY (US); Boris Druz, Brooklyn, NY (US); Viktor Kanarov, Bellmore, NY (US); Adrian J. Devasahayam, Woodmere, NY (US); Emmanuel Lakios, Mt. Sinai, NY (US)

(73) Assignee: Veeco Instruments Inc., Woodbury, NY (US)

( * ) Notice: Subject to any disclaimer, the term of this patent is extended or adjusted under 35 U.S.C. 154(b) by 0 days.

(21) Appl. No.: 10/126,928

(22) Filed: Apr. 19, 2002

Related U.S. Application Data
(60) Provisional application No. 60/284,957, filed on Apr. 19, 2001.

(51) Int. Cl.[7] .................... C23C 14/34; B05C 11/11; H05H 1/24
(52) U.S. Cl. ............... 204/192.11; 204/192.12; 204/298.04; 204/298.11; 118/504; 427/569; 427/248.1
(58) Field of Search .................. 204/298.11, 298.04, 204/192.11, 192.12; 118/404; 427/569, 248.1

(56) References Cited

U.S. PATENT DOCUMENTS

| | | | |
|---|---|---|---|
| 5,514,477 A | 5/1996 | Ohashi et al. | 428/457 |
| 6,063,244 A | 5/2000 | Pinarbasi | 204/192.11 |
| 6,139,906 A | 10/2000 | Hegde et al. | 427/125 |
| 6,197,164 B1 | 3/2001 | Pinarbasi | 204/192.11 |
| 6,419,803 B1 * | 7/2002 | Baldwin et al. | 204/192.13 |
| 6,547,939 B2 * | 4/2003 | Hsueh et al. | 204/298.03 |

FOREIGN PATENT DOCUMENTS

| | | | |
|---|---|---|---|
| EP | 0 908 532 A2 | 4/1999 | C23C/14/46 |
| EP | 0 962 547 A1 | 12/1999 | C23C/14/46 |

* cited by examiner

Primary Examiner—Steven H. VerSteeg
(74) Attorney, Agent, or Firm—Boyle Fredrickson Newholm Stein & Gratz S.C.

(57) ABSTRACT

A deposition system includes a substrate holder supporting a substrate defining at least one topographical feature. In addition, the system includes a deposition plume that is directed toward the substrate. A first profiler mask is positioned between the deposition plume and the substrate, and is shaped so as to reduce inboard/outboard asymmetry in a deposition profile associated with the feature.

51 Claims, 12 Drawing Sheets

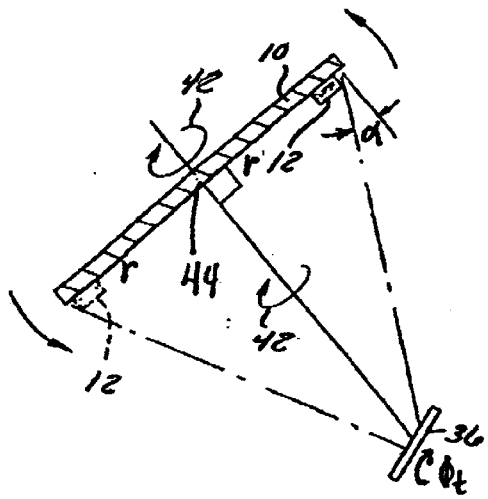
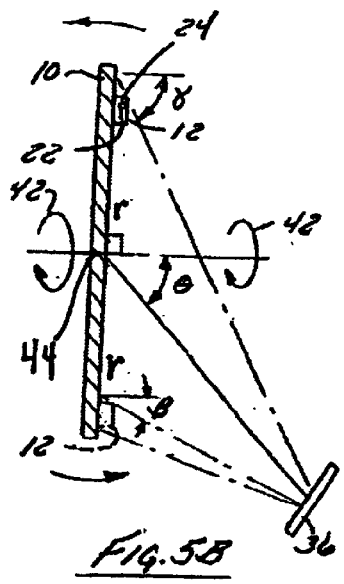
FIG.5A
FIG.5B
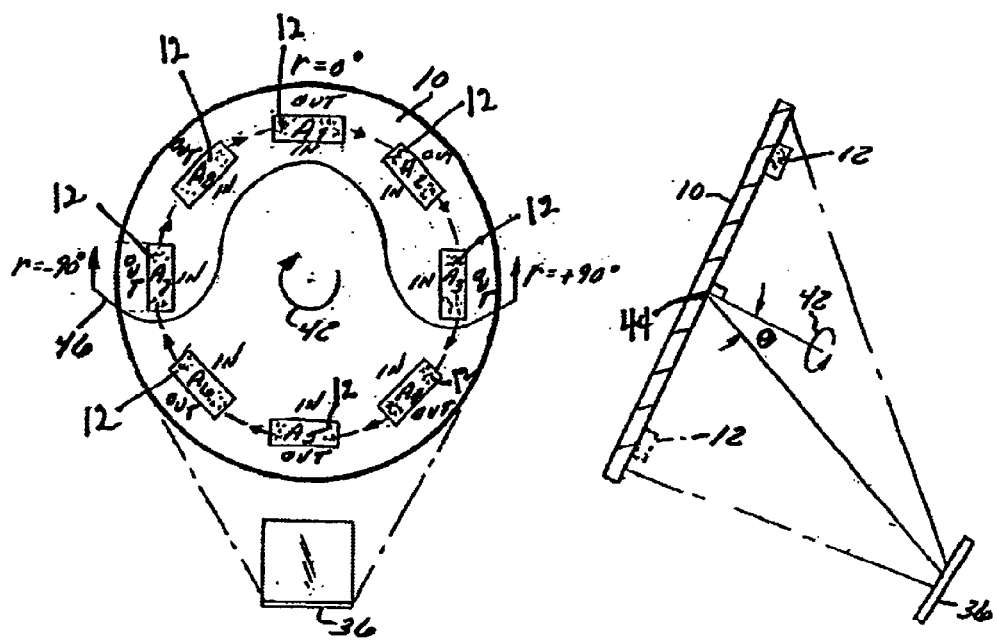
FIG.6A
FIG.6B

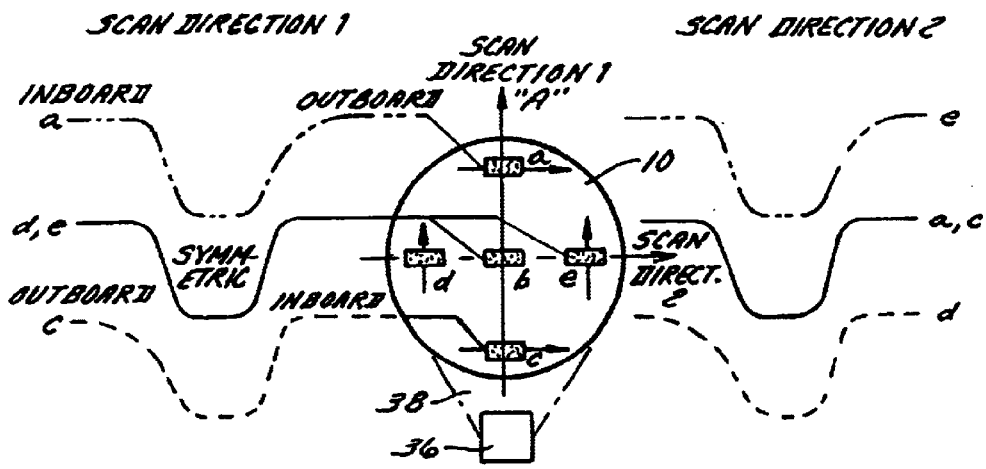
FIG. 9
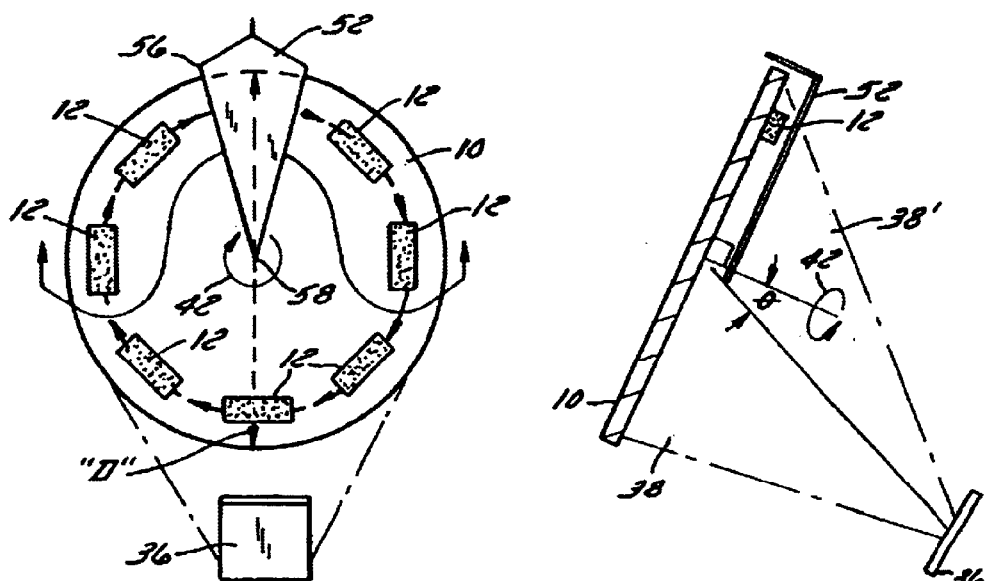
FIG. 10A
FIG. 10B

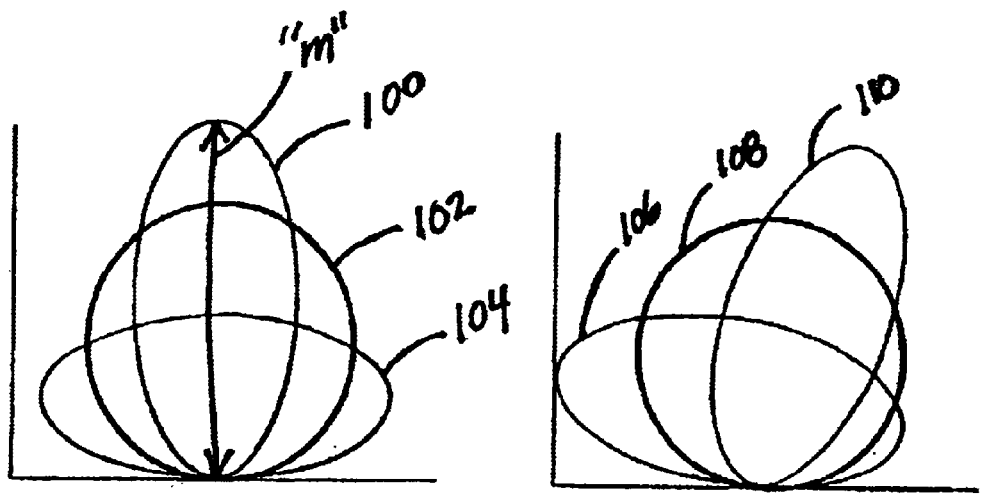
FIG. 15A
FIG. 15B
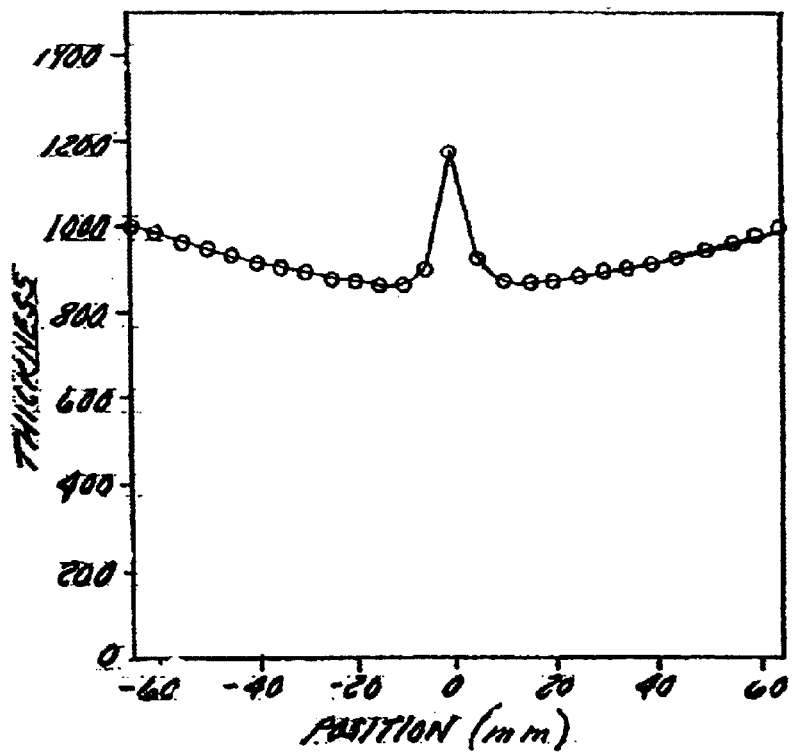
FIG. 16A

METHOD AND APPARATUS FOR CONTROLLING FILM PROFILES ON TOPOGRAPHIC FEATURES

CROSS-REFERENCE TO A RELATED APPLICATION

This application claims priority under 35 U.S.C. §119(e) to U.S. Provisional Patent Application No. 60/284,957, filed Apr. 19, 2001, the entirety of which is incorporated by reference herein.

FIELD OF THE INVENTION

The invention is directed to depositing a thin film on a substrate. More particularly, the preferred embodiment relates to controlling the deposition of thin films on a substrate during film deposition and controlling outboard shadowing and thus inboard-outboard asymmetry.

BACKGROUND

A variety of deposition techniques are known for depositing thin film material. Such techniques include sputter deposition, ion beam sputter deposition (IBD), and long-throw physical vapor deposition (PVD) systems. PVD is a thin film deposition process in the gas phase in which source material is physically transferred in a vacuum to a substrate without any chemical reaction involved. PVD includes both thermal and e-beam evaporation and sputtering. Additionally, thin films can be deposited using low pressure chemical vapor deposition in which chemical vapor deposition is performed at a pressure below atmospheric pressure.

Many of these deposition processes require deposition of thin films on substrates having particular topographical features that affect the distribution and properties of deposited material across the substrate. For example, lift off deposition processes are used in many important thin film feature fabrication processes, such as in the manufacture of magnetic heads and semiconductor devices. An exemplary substrate 10, i.e., a wafer, showing layout features 12 thereon is illustrated in FIG. 1. Notably, layout features 12 are typically fabricated from photoresist, which is selectively removed according to the written pattern after a lift off step. Lift off deposition processes allow definition of a pattern on a wafer surface without etching, and are typically used to define geometry of hard to etch metals, such as gold. In such processes, metal is lifted off in selected areas by dissolving underlying resist.

In a typical IBD process, for example, the substrate 10 is rotated during am deposition about a central axis or center 44 (FIG. 3). Features 12 on the substrate 10 have an inboard side 22, which is the side facing toward the center 44, and an outboard side 24, which is the side facing away from the center 44, these sides being illustrated in FIGS. 2A, 2B, and 2C. As discussed in further detail below, control of the deposition profile on the inboard/outboard sides of a feature is often critical to device performance.

IBD is particularly well suited for lift off processes due to some unique features IBD possesses. The low process pressures and directional deposition are chief among them. These enable the lift-off step to be extremely clean and repeatable down to very small critical dimensions, e.g., for example, less than 0.5 μm.

In recent years, IBD has become the method of choice for deposition of stabilization layers for thin film magnetic heads because such an application requires a lift off step subsequent to the deposition of the stabilizing material.

In addition to good lift-off properties, IBD films have extremely good magnetic properties. Additionally, in IBD processes it can be very convenient to position system components to optimize the properties of the deposited film and to rotate the substrate to average out certain non-uniformities introduced by the tilting and other process steps.

For most applications, control of the deposited material onto the substrate is needed. In the fabrication of structures in which one axis is much longer than the other, e.g., in optical cross connect micro-electro mechanical systems (MEMS) where there is a very long vertical flap inside a wide trench, deposition control is critical. In particular, without sufficient control of the deposited optically reflecting metal coating, the flap can buckle due to the stress imbalance on the opposite sides of the flap. More generally, various standards relating to material deposition have been developed for the fabrication of semiconductor devices.

Next, variations in the thickness of the thin layer is a common problem in thin film deposition. As known in the art, these variations are exacerbated when, for example, photoresist masks are used in the lift-off steps. Techniques have been developed to control the overall thickness of layers of deposited materials onto the substrate. For example, a flux regulator has been used to help control the overall thickness of deposited thin layers by impeding the path of portions of the sputtered beam.

However, flux regulators have not been used to address problems associated with asymmetry in sidewall profiles. It is desirable to have symmetric profiles of the deposited material across the sidewall of device features on a substrate because otherwise device performance can be severely compromised. For example, in the manufacture of magnetic heads, the symmetry of the profile of the deposited material obtained after the lift-off step is imperative for stable performance of the device. Therefore, ideally, the deposition is controlled to maintain an appropriate profile.

A drawback of previous thin film deposition processes is that they cannot adequately control the profiles on either side of the photoresist, even when known flux regulators are used. One cause of this is the so-called "inboard-outboard" effect. This means that one side of a feature is more heavily coated than the other side, thus creating an asymmetric profile. This effect is a result of the fact that an off-center point on the substrate is bombarded by more atoms incident from the inboard side of the feature than the outboard side, for example, when the center axes of the target and substrate are collinear. This asymmetry is usually most pronounced at the edge of the substrate.

The source of this problem is related to the divergence of the deposition flux. Based on the geometry of the set-up, this divergence causes variations in the beam that impinges upon the substrate. As a result, asymmetric shadowing of the features occurs and creates an asymmetric profile of the deposited material, as shown is in the prior art depictions in FIGS. 2A–2C. FIG. 2A shows asymmetric deposition 20 and 20' on an inboard side 22 and an outboard side 24, respectively, of a lift-off photoresist feature 12 on a substrate 10. In this case, the slope of the profile at the inboard side 22 is significantly steeper than the slope of the profile at the outboard side 24, which can substantially compromise device performance. Again, ideally, these sidewalls are not sloped, i.e., the sidewalls are perfectly vertical for optimum device performance.

FIGS. 2B and 2C show basic elements that represent actual device features that may be more complicated, e.g., with multiple layers, more complicated topography. The step feature 112 of FIG. 2B represents, for example, the contact formed by the leads and the permanent magnet layers on the walls of the MR sensor shown in FIG. 9 of U.S. Pat. No. 6,139,906 to Hedge et al., the entirety of which is incorporated by reference herein. This is actually just as critical for the device performance as the slope of the deposited film formed with the lift-off mask that is discussed above. Alternatively, the step feature 112 represents the long vertical flap of an optical cross connect MEMS device, in which case without sufficient control of the deposited optically reflecting metal coating. Alternatively, the device may be a laser bar or integrated laser device on a wafer, in which case the sidewalls of feature 112 would reflect the laser facets, and the coating would be a reflective or antireflective coating. Control of such coating thicknesses are critical to the laser performance.

FIG. 2B depicts asymmetric deposition 120 and 120' on an inboard side 122 and an outboard side 124, respectively, of a permanent photoresist feature 112 on a substrate 110. In the prior art, typically, the inboard side 122 of the step feature 112 has more material deposited thereon.

The trench feature 212 of FIG. 2C is one that is commonly found in microelectronic device manufacturing. When a certain material is etched with a photoresist mask, the mask is removed, and a second layer of material is deposited over the trench feature 212 in a continuation of the device process. Trench feature 212 may be the result of a series of successive coatings where the patterning process occurred below the surface of the feature 212 shown, but where each subsequent coating, by conforming to the patterned feature 212, transferred the trench feature 212 to the next coating step, respectively. This could be for example an ultrathin corrosion resistant coating deposited on a completely patterned thin film magnetic head transducer, which must be as thin and conformal to the patterned surface as possible.

FIG. 2C illustrates asymmetric deposition 220 and 220' on an inboard side 222 and an outboard side 224, respectively, of a trench feature 212 on a substrate 210. In the prior art, the inboard side 222 of the trench feature 212 typically was deposited with more material than the outboard side 224, resulting in an asymmetric deposition, as is shown in FIG. 2C. Again, such an asymmetric deposition profile can significantly compromise device performance.

In sum, the art of thin film deposition was in need of a method and apparatus of controlling deposition profiles, and particularly, inboard/outboard asymmetry relative to device features.

SUMMARY OF THE INVENTION

The preferred embodiment overcomes the drawbacks associated with prior systems by providing a deposition system that minimizes the occurrence of asymmetric deposition profiles. The invention achieves symmetric profiles, in the first instance, by tilting the substrate to provide non-normal flux incidence on the substrate. Furthermore, the preferred embodiment utilizes one or more strategically shaped and positioned profiler masks that selectively block portions of the flux to specifically obviate the problem of deposition asymmetry. In an alternative, the profiler mask(s) is modified to also provide uniformity shaping of the deposited material.

According to one aspect of the preferred embodiment, a deposition system includes a substrate holder supporting a substrate defining at least one topographical feature. In addition, the system includes a deposition flux that is directed toward the substrate. A first profiler mask is positioned between the deposition flux and the substrate, and is shaped so as to reduce inboard/outboard asymmetry in a deposition profile associated with the feature.

In accordance with another aspect of this preferred embodiment, the profiler mask has a shape of a sector of a circle. In accordance with yet another aspect of this preferred embodiment, the profiler mask includes a solid portion and an open portion.

According to another aspect of the preferred embodiment, an apparatus to reduce inboard/outboard asymmetry in thin-film profiles includes a profiler mask that is disposed between a deposition flux directed toward a substrate and the substrate. The profiler mask being shaped so as to block the same amount of arc of the substrate along a length of the mask.

According to yet another aspect of the preferred embodiment, a method of controlling deposition asymmetry on sides of features disposed on a substrate includes directing a deposition flux toward the substrate. The substrate is tilted so that the deposition flux impinges on the substrate at a non-normal incident angle. A first profiler mask is inserted between the deposition flux and the substrate to at least partially block the deposition flux so as to reduce inboard/outboard asymmetry.

In accordance with another aspect of this preferred embodiment, the profiler mask is inserted in a region at about a position furthest away from the sputter target. In accordance with yet another aspect of this preferred embodiment, the deposition flux is generated by directing a beam of ions toward a target of a material to be sputtered. A second profiler mask is inserted between the deposition flux and the substrate to at least partially block deposition of the thin film on the substrate. In a preferred embodiment, first and second profiler masks are inserted 90 degrees and –90 degrees, respectively, relative to either side of a point furthest away from the sputter target.

BRIEF DESCRIPTION OF THE DRAWINGS

Preferred exemplary embodiments of the invention are illustrated in the accompanying drawings, in which like reference numerals represent like parts throughout and in which:

FIG. 5A is a side elevational schematic diagram of substrate and a typical ion beam deposition system, showing the substrate and a normal incidence angle of a deposition plume;

FIG. 5B corresponds to FIG. 5A and shows the substrate and an off normal incidence angle of deposition plume;

FIG. 6A is a front elevational schematic diagram of a substrate and a typical ion beam deposition system, illustrating the region of the substrate that is subject to the negative effects of the outboard deposition;

FIG. 6B is a side elevational schematic diagram, corresponding to FIG. 6A;

FIG. 9 is a front elevational schematic diagram of the preferred embodiment, and graphs demonstrating profiles of features obtained after lift-off, illustrating the inboard/outboard effect;

FIG. 10A is a front elevational schematic diagram of the sputter target and the substrate, showing the location and effect of the deposition plume profiler of a preferred embodiment;

FIG. 10B is a side elevational view corresponding to FIG. 10A;

FIG. 15A is a schematic diagram of varying flux distributions whose cross sections have an axis that is in line with an axis of the substrate;

FIG. 15B is a schematic diagram of varying flux distributions whose cross sections have an axis that is at an angle with an axis of the substrate;

FIG. 16A is a graph illustrating a deposition profile of a substrate after deposition using the combination shaper of FIG. 13;

Figure 1:
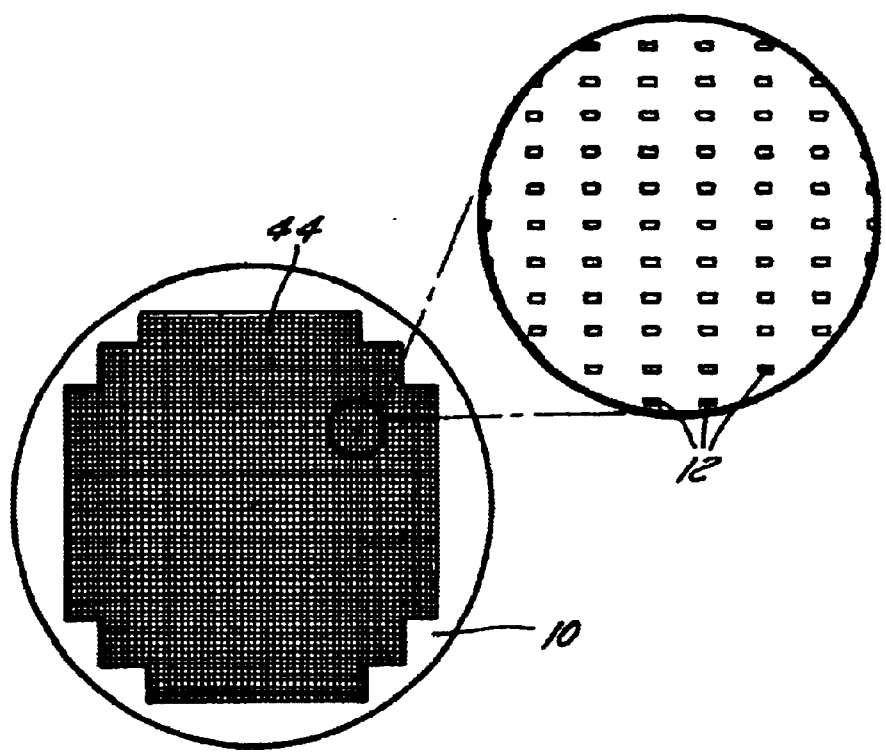
FIG. 1 is a top schematic diagram of a substrate, showing layout features in magnified form.

Before explaining embodiments of the invention in detail, it is to be understood that the invention is not limited in its application to the details of construction and the arrangement of the components set forth in the following description or illustrated in the drawings. The invention is capable of other embodiments or being practiced or carried out in various ways. Also, it is to be understood that the phraseology and terminology employed herein is for the purpose of description and should not be regarded as limiting.

DETAILED DESCRIPTION

Figure 3:
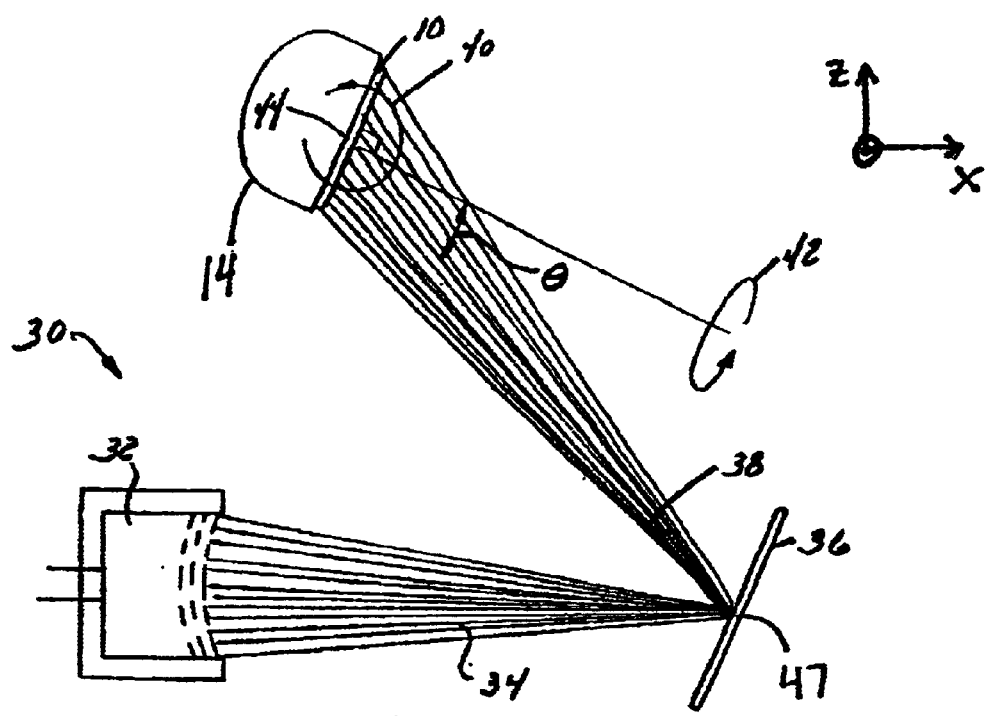
FIG. 3 is a schematic diagram showing a typical configuration of a substrate and a typical ion beam deposition system, including a deposition flux source which directs an ion beam toward a sputter target to generate a deposition plume that is directed towards the substrate.

Referring initially to FIG. 3, a representative deposition tool 30 includes a deposition flux source 32, which directs a beam 34 of ions toward a sputter target 36 to generate a deposition plume 38 containing atoms of the sputter target 36, i.e., a deposition flux. The deposition plume 38 is directed towards a substrate 10, which is held in a holder 14 and which becomes coated with atoms of the deposition plume 38 to form a thin film of the target material. As indicated by arrow 42, the substrate 10 is rotated about a center 44 of the substrate 10 during the deposition.

Notably, several factors affect the inboard/outboard problem, including substrate tilt, substrate rotation, and deposition angle. The substrate 10 can be tilted at an angle, as indicated by arrow 40 of FIG. 3. The angle at which the substrate 10 is tilted defines a deposition angle $\theta$. More particularly, $\theta$ is defined as the angle between the axis of rotation through the center 44 of the substrate 10 and the center 47 of the sputter target 36 along the central axis of the deposition plume 38. It should be noted that although FIG. 3 shows only one angle $\theta$, there are actually multiple angle $\theta$s from one side of a target to the other side of the spot. In FIG. 3 the deposition angle is about 35°. Notably, substrate tilt can be optimized for desired deposition results.

The preferred substrate tilt is determined empirically. At a normal incidence, the steepest sidewall results. In contrast, at a non-normal incidence, a tapering of the sidewall results due to more significant shadowing of the feature 12 (see FIG. 5B and description below). Moreover, with a normal incidence, there are large differences between the inboard and outboard sides of the profile due to the fact that the outboard side 24 is always shadowed, whereas the inboard side 22 is always exposed to the deposition plume 38. To the contrary, with a non-normal incidence, sidewalls are even more slanted with such increasing deposition angles, and there are less differences between the inboard and outboard sides of the profile due to the fact that the outboard side 24 of the feature 12 is exposed to the deposition plume 38 and the inboard side 22 is shadowed during part of the time of the substrate 10 rotation (see FIG. 5B). Moreover, independent of normal/non-normal incidence, the shape of the sidewall is affected by the location of the feature 12 relative to the center 44 of the substrate 10.

Depending upon the application, the geometry of the set-up is configured accordingly. As is described in U.S. Pat. No. 6,139,906, depositing an underlayer of Cr at a different angle from the overlaid film allows one the ability to (1) modify (e.g., enhance) the coercivity of Cr/CoCrPt films, and (2) modify (e.g., decrease) the resistivity of Cr/Ta films can be decreased. Additionally, varying the deposition angle of multilayered films also allows for further optimization of the abutted permanent magnet junction in corresponding thin film.

As discussed, during deposition, the deposition plume 38 may impinge the substrate 10 at a "normal incidence" or a "non-normal incidence." Where there is "normal incidence," the substrate normal is collinear with the central axis of the deposition plume 38 or on the line of sight between the center 44 of the substrate 10 and the deposition flux source (i.e., the sputter target 36) (typically the center 47 of sputter a target 36). In other words, for any two points on the substrate 10 at the same radius "r" from the center 44 of the substrate 10, the distance from each point to the center of the sputter target 36 is the same. It is important to note that the angular position of the sputter target 36 with respect to the substrate 10 is not specified in this definition. This angular position affects the magnitude of the flux distribution on the substrate 10, but the angular direction of the flux is mainly determined by the line of sight between the deposition flux source 32 and the specified position on the substrate 10.

Where there is a "non-normal incidence," the substrate normal is tilted with respect to the line of sight between the sputter target 36 and the substrate 10. In addition, as noted above, the angle of substrate tilt can be empirically optimized to control the profile of sidewall deposition for the particular substrate tilt angles used.

Figure 2A:
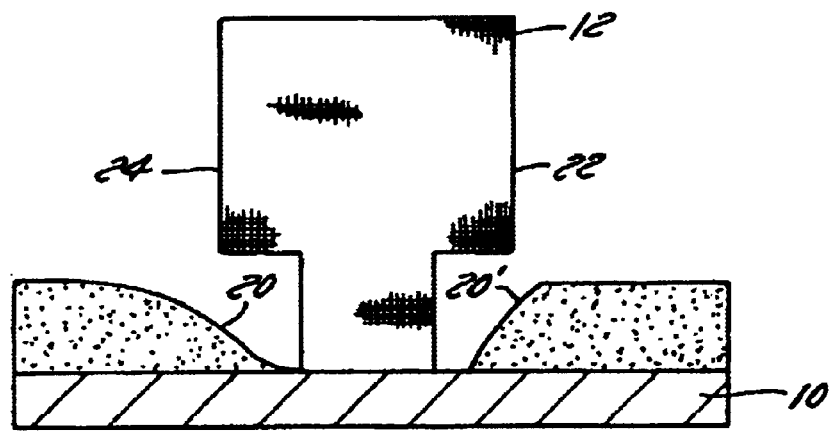
FIG. 2A is a more detailed sectional schematic diagram of a single lift-off feature on the substrate of FIG. 1, showing an asymmetric profile of deposited material using a prior art method.
Figure 2B:
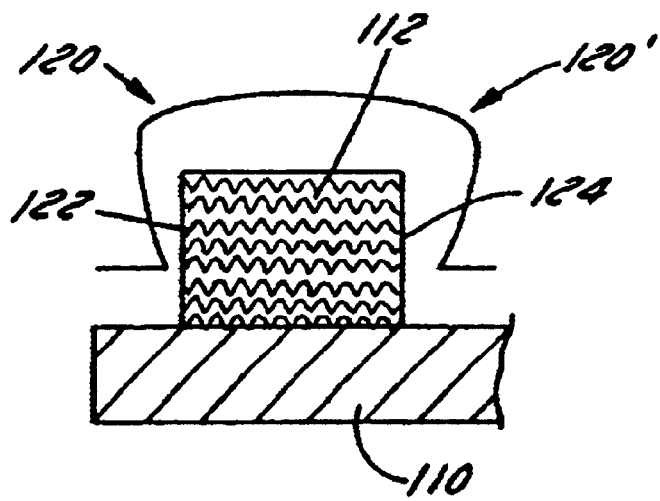
FIG. 2B is sectional schematic diagram showing an asymmetric profile of deposited material on a permanent feature using a prior art method.
Figure 2C:
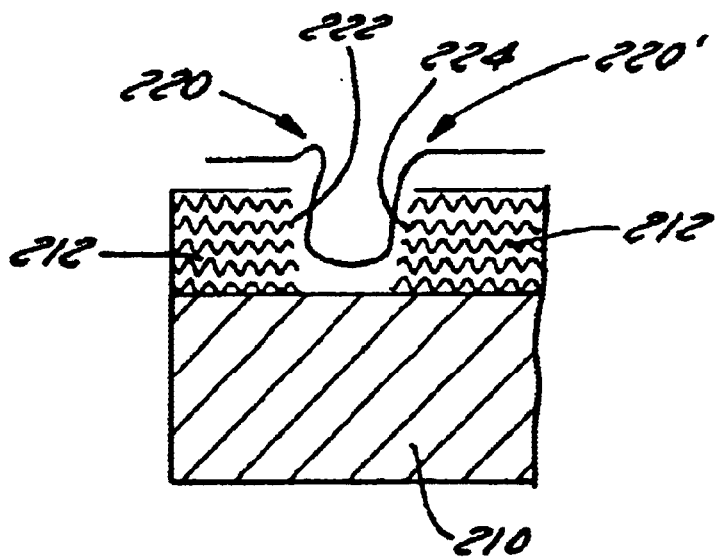
FIG. 2C is sectional schematic diagram showing an asymmetric profile of deposited material on a trench feature using a prior art method.
Figure 4:
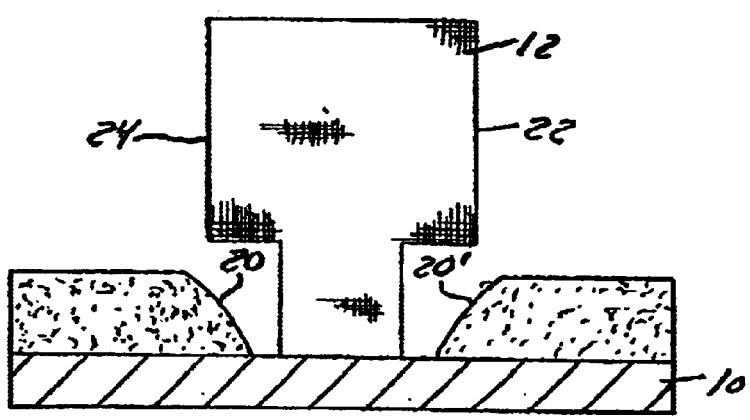
FIG. 4 is sectional schematic diagram of a single lift-off feature on the substrate showing a symmetric profile of deposited material resulting from the invention.

FIG. 4 shows one of the features 12 in the magnified portion of the FIG. 1, in cross section. Each feature 12 has an inboard side 22, which is the side of the feature 12 that faces the center 44 of the substrate 10, i.e., the radial inward side, and an outboard side 24, which is the side of the feature 12 that faces away from the center 44 of the substrate 10, i.e., the radial outward side. The invention can also be used with step features 112, such as the permanent feature 112 shown in FIG. 2A and with trench features 212, such as the trench feature 212 shown in FIG. 2C.

A primary cause of the inboard/outboard effect is illustrated in FIGS. 5A and 5B, which show the resulting asymmetry obtained with normal (FIG. 5A) and off-normal (FIG. 5B) directions of flux distribution on the substrate 10 from the sputter target 36. Sputter target 36 is positioned relative to the substrate 10 at an angle $\theta_r$. It should be noted that both FIGS. 5A and 5B show a single feature 12 in two positions, a first position shown in solid line and a second position, which is 180° from the first position, shown in phantom.

With more particular reference to FIG. 5A, when the substrate 10 is normal to the flux direction, the inboard side 22 of the feature 12 at any position on the substrate 10 is essentially not shadowed. In contrast, the outboard side 24 of the feature 12 at any given radius "r" from the center 44 of the substrate 10 will be shadowed depending on the divergence of the deposition flux plume 38. In addition, at any given radius "r," the angle of shadowing a on the outboard side 24 is the same.

FIG. 5B shows a situation in which the substrate normal is tilted with respect to the line of sight between the sputter target 36 and the substrate 10. When the feature 12 is at the bottom of the substrate 10, there is no shadowing effect on the outboard side 24 of the feature 12 and the inboard side 22 experiences shadowing at an angle of $\beta$. When the feature 12 is at the top of the substrate 10 (after the substrate 10 rotates 180°), the outboard side 24 of the feature 12 experiences shadowing at an angle of $\gamma$. Of note, $\gamma$ is greater than a due to the divergence of the deposition plume 38. In fact, $\gamma \sim \theta + \alpha$. That is, the shadow angle $\gamma$ on the outboard side 24 at a non-normal angle of incidence is roughly equal to the deposition angle $\theta$ plus the shadow angle $\alpha$ on the outboard side 24 at a normal angle of incidence. Thus, for a non-normal angle of incidence, the inboard side 22 of the feature 12 is shadowed during half of the rotation at an angle of $\beta$ and is generally not shadowed during the other half of the rotation. And, the outboard side 24 is shadowed at an angle other than $\gamma$ during half of the rotation and at an angle of $\gamma$ during the other half of the rotation.

In sum, the asymmetrical effect is different at a normal angle of deposition (FIG. 5A) than it is at a non-normal angle of deposition (FIG. 5B) in the sense that at a normal angle of deposition, the outboard side 24 of the feature 12 is always shadowed, to a degree dependent on its radial position on the substrate 10. In contrast, in the off-normal deposition case (FIG. 5B), the outboard side 24 is periodically shadowed at different angles depending on the azimuthal position of feature 12 on substrate 10 during rotation, and the inboard side 22 is shadowed during half of the rotation.

To further illustrate this effect for non-normal incidence, a side and front schematic diagram of a substrate 10 being deposited is shown in FIGS. 6A and 6B, which show the progress of a single feature 12 (marked as being at positions 'A1' to 'A8' in FIG. 6A) on the substrate 10 as the substrate 10 rotates through 360 degrees. The azimuthal angle, "Γ," is shown in FIG. 6A as being zero degrees at the point furthest from the sputter target 36. The azimuthal angle is measured clockwise relative to the point furthest from the sputter target 36. A region at which shadowing of the outboard side 24 of the feature 12 occurs is indicated in FIG. 6A as a region located above the arrow 46. Notably, the region above arrow 46 corresponds to the locations on the substrate 10 that are farther away from the sputter target 36 ($A_{1-3}$, $A_{7-8}$, or Γ=90 to 90 degrees, clockwise). In positions close to the sputter target 36, the outboard side 24 of the feature 12 is not shadowed. As the feature 12 rotates into the region furthest from the sputter target 36 ($A_1$, Γ=0 degrees, as is represented in the top feature 12), the shadow is the longest (FIG. 6B and 5B). Conversely, regions where shadowing of the inboard side 22 of the feature 12 occurs are marked in FIG. 6A and correspond to the locations on the substrate 10 that are closest to the sputter target 36 ($A_{4-6}$, $A_{7-8}$ =90 to −90 degrees, clockwise). This difference between the inside and outside regions of the features 12 results in the inboard-outboard effect.

Figures 7A, 7B:
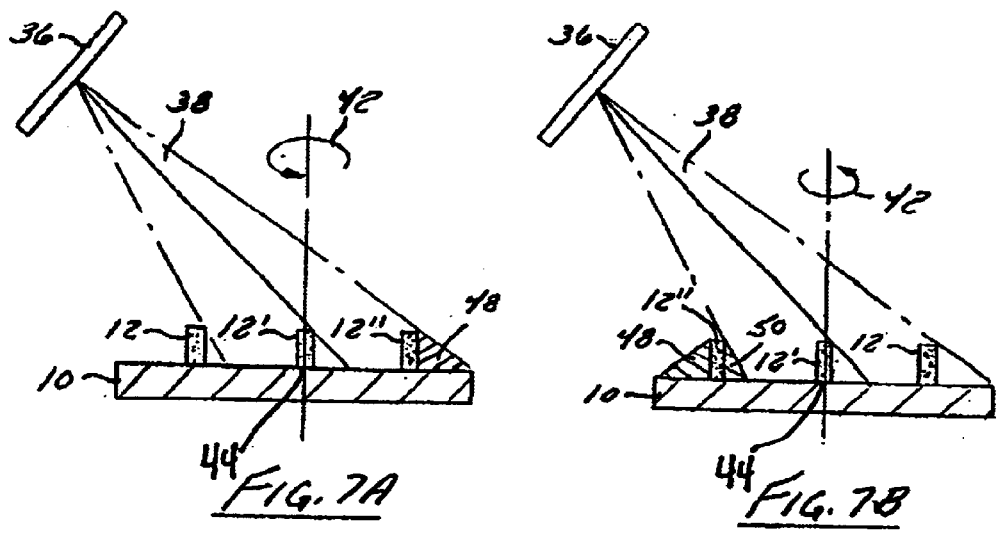
FIG. 7A is a side elevational schematic diagram of a sputter target and a substrate with three features distributed across the surface of the substrate, and showing a difference between shadowing on the inboard side and the outboard side.
FIG. 7B is a side elevational schematic diagram of the substrate and the sputter target of FIG. 7A, showing the substrate in a second position with features rotated 180° from the first position of FIG. 7A.

FIGS. 7A and 7B illustrate another difference between the inboard side 22 and outboard side 24 of the feature 12. FIG. 7A depicts a first position of the substrate 10 and its features 12, 12', and 12", and FIG. 7B depicts the substrate 10 and its features 12, 12', and 12" in a second position (after the substrate 10 rotates 180 degrees). FIGS. 7A and 7B show that the inboard/outboard effect is not seen at the center 44 of the substrate 10 (see feature 12') because at this location the shadowing is generally perfectly symmetric. However, at the edges of the substrate 10, features 12 and 12", the outboard region is subject to a long shadow (indicated by 48 on feature 12" in FIGS. 7A and 7B), while, after rotating 180 degrees, the inboard region is subject to a much shorter shadow (indicated by 50 on feature 12" in FIG. 7B). This shadowing effect increases for features 12 located more radially outwardly from the center 44 of the substrate 10.

Another more subtle effect on deposition profiles is the deposition rate. The deposition plume 38 diverges as it leaves the sputter target 36. The outboard region experiences a lower deposition rate since it is effectively further away from the sputter target 36. The inboard region experiences a higher deposition rate since it is closer to the sputter target 36. Thus, the inboard-outboard effect has at least three consequences. First, longer shadows occur on the outboard side 24 of a feature 12, resulting in a long taper of the deposited material. Second, the shadowing effect is amplified the further the features 12 are away from the center 44 of the substrate 10. Third, thinner material is deposited on the outboard side 24, due to the outboard region being further away from the sputter target 36.

Figure 8:
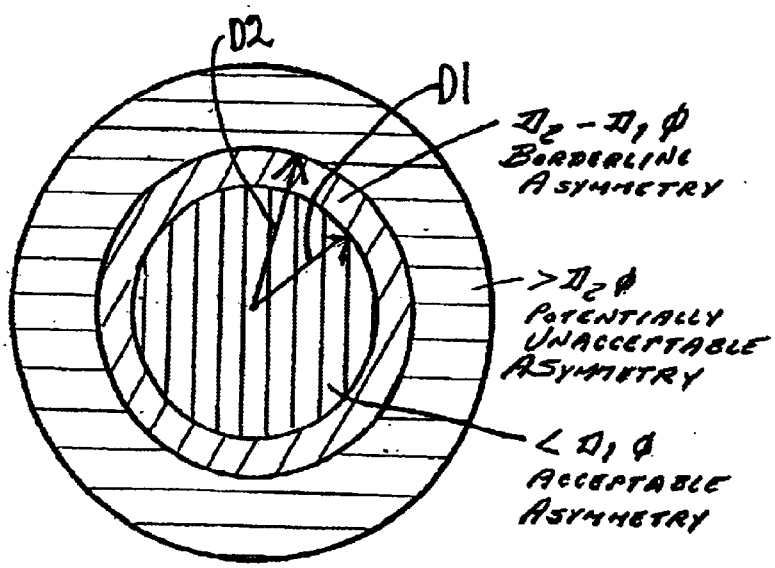
FIG. 8 is a schematic diagram illustrating distribution of three regions of asymmetric deposition.

For a substrate 10 on which features 12 are distributed evenly in a Cartesian coordinate system, only the center 44 of the substrate 10 has features 12 that have associated deposition profiles that are symmetric, (see feature 12' in FIGS. 7A and 7B). Moving radially outwardly from the center 44, the symmetry of the profile deteriorates. This effect is illustrated in FIG. 8, which shows a generalized device (substrate) 10 with three regions of symmetry/asymmetry. The innermost region, Region 1, has a diameter of less than $D_1$ and is a region of acceptable asymmetry for the particular application. The middle region, Region 2, has a diameter between $D_2$ and $D_1$ defining region of borderline asymmetry. The outermost region, Region 3 has a diameter greater than $D_2$ defining a region of potentially unacceptable asymmetry. The exact values of each of these dimensions depends on many factors including the device design and tolerance, the type of photoresist material used, and the geometry of the deposition tool. For example, for magnetic heads considering a typical tool geometry, in most cases, the asymmetry associated with this position is acceptable up to a four-inch diameter. Beyond this, the asymmetry can be potentially unacceptable.

It should be noted that the above explanations treat the deposition plume 38 as originating from a finite, well-confined sputter target 36 on the order of the size of the substrate 10, located a few diameters away from the substrate 10. In general, this is applicable to most IBD and PVD systems and other sputtering systems. In particular, it is also applicable to evaporation, long-throw sputtering, and other sputtering systems. The divergence angle of the flux depends on this geometry. If the sputter target 36 were such as to provide a perfectly collimated flux across the entire diameter of the substrate 10, there would be no divergence, no shadowing effects at normal incidence, and no inboard-outboard effect at all. However, such an ideal deposition flux is not practical. In practice, several conditions limit attaining an ideal deposition flux. The main limitation in IBD or long throw, low pressure PVD systems is the size of the target with respect to the size of the substrate. Target size is limited by the cost of target materials (which may contain precious metals, such as Au or Pt, for example, and equipment costs required to accommodate large targets 36 (aggravated by the fact that multiple targets 36 are used in a single deposition module, in many cases). In particular, in IBD, the ion beam 34 often is focused on the sputter target 36 to prevent ion beam sputtering of other components in the process chamber. As known in the art, this limitation to a small illuminated target means that the flux divergence across the substrate will be large. Continuing the inboard/outboard effect can be measured by taking profile scans of features 12 distributed across a substrate 10 with features 12 defined by a photoresist lift-off pattern. Such profile scans are shown in FIG. 9. After the deposition and the photoresist was lifted off, feature-localized thickness profiles were taken for five features 12 at locations 'a'–'e,' which include locations at the edges of the substrate 10 as well as at the center 44. FIG. 9 shows the asymmetry associated with the location of the features 12 more particularly shown in FIG. 9 on the substrate 10. As expected, features 12 at locations 'a' and 'c', show the biggest asymmetry when measured in "Scan Direction 1," while features at the center 44 are perfectly symmetric when measured in "Scan Direction 1." It is also important to note that features 12 located at 'd' and 'e' are symmetric when scanned in "Scan Direction 1." However, when these same features 12 at locates "d" and "e" are measured orthogonally ("Scan Direction 2"), the features 12 display an asymmetry. By the same token, features 12 located at 'a' and 'c' are symmetric when measured in direction 2. That is, radially aligned features 12 are not affected by the inboard/outboard effect, whereas tangentially aligned features 12 are most affected.

As noted previously, asymmetry leads to many problems, including sub-optimal magnet, optical, and electrical properties of the fabricated devices. Therefore, controlling this phenomenon is critical. Notably, controlling inboard/outboard symmetry applies not only to the above-described processes, but to any general structure that has one axis that is much longer than the other, such as long trenches where the inboard/outboard control on the sidewalls is needed and long thin vertical walls such as in micro-electromechanical systems (MEMS). Furthermore, as devices become smaller, and more features 12 are used, tolerances have to be tighter.

It has been discovered that, in the preferred embodiment, sidewall profiles can be controlled by using the variation in shadowing as a function of azimuthal angle of the feature 12 for off-normal incidence angle of deposition plume 38. By tilting the substrate 10 such that there is non-normal incidence between the substrate 10 and the deposition plume 38, the outboard side 24 of a feature 12 is exposed part of the time to the deposition plume 38. In contrast, when there is normal incidence between the substrate 10 and the deposition plume 38, the outboard side 24 is always shadowed. However, tilting the substrate 10 also introduces a greater shadowing angle when a feature 12 is located away from the sputter target 36, and introduces a shadow on the inboard side 22 of the feature 12 when the feature 12 is near the sputter target 36.

A specially designed deposition profiler mask 52 (also referred to as a "profiler mask") is strategically inserted between the sputter target 36 and the substrate 10 such that the angular deposition of deposited material on the substrate features 12 is significantly affected, leading to a controlled sidewall deposition profile. In a preferred embodiment, the profiler mask 52 blocks at least most of the undesirable deposition angles. Note, the material from which the profiler mask 52 is made may be any process compatible rigid material, such as stainless steel.

The location and position of the profiler mask 52 is controlled to achieve optimum results. Typically, optimization of the location and position of the profiler mask 52 is determined empirically. In this regard, to minimize shadowing and inboard-outboard asymmetry, the profiler mask 52 preferably blocks the flux that reaches the substrate 10 at the most extreme angle, i.e., at the location furthest away from the sputter target 36.

Preferably, the profiler mask 52 is located at an azimuthal angle $\Gamma=0$ degrees, i.e., the point furthest away from the sputter target 36, as shown in FIGS. 10A and 10B. At this location, the profiler mask 52 blocks this extreme angle of deposition. This blockage is schematically indicated in FIG. 10B by deposition plume 38 and deposition plume 38', which is the beam that is partially blocked by the profiler mask 52. It is also preferred to locate the profiler mask 52 in a range of 90 degrees relative to either side of $\Gamma=0$ degree, that is within a range between 90 degrees and 90 degrees, including the $\Gamma=0$ degrees location. Locating the profiler mask 32 within this range advantageously blocks the deposition plume 38 to minimize profile asymmetry. Where the profiler mask 52 is located opposite to this position at $\Gamma=180$ degrees, i.e., closer to the sputter target 36, the profiler mask 52 minimizes the inboard shadowing. Nevertheless, this location of the mask 52 also increases the inboard-outboard effect.

A single profiler mask 52 or multiple profiler masks 52 can be used. Several factors can be considered when using multiple profiler masks 52. For example, if the outboard shadowing is sufficiently blocked by a profiler mask 52 or set of profiler masks 52 in the position furthest from the sputter target 36 (Γ=0 degrees), the placement of a second profiler mask 52 or set of profiler masks 52 at 180 degrees improves both the inboard-outboard asymmetry and the shadowing effects on the inboard side 22 and outboard side 24.

Figure 11:
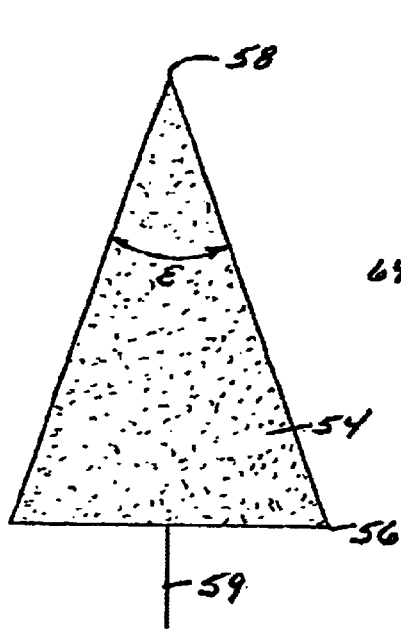
FIG. 11 is a front schematic diagram of an inboard/outboard profiler.

Referring now to FIG. 11, a first preferred embodiment of the profiler mask 52 is referred to herein as an inboard/outboard profiler 54. The inboard/outboard profiler 54 preferably has a basic pie or sector shape of angle ϵ. In a preferred embodiment, the sector ranges in angle from about 10 degrees to about 180 degrees. The sector shape of the inboard/outboard profiler 54 is tapered to define an apex 58 at one end and a base 56 at the opposite end. The inboard/outboard profiler 54 is retained in place with a holder 59 (FIG. 11) that extends from the base 56. The inboard/outboard profiler 54 preferably is positioned with the apex 58 at or near the center 44 of the substrate 10 and the base 56 at or near the edge of the substrates 10, as shown in FIGS. 10A and 10B. It should be designed and held in such a manner so as to ensure that the outermost edge of the substrate is completely masked within the angle ϵ. The inboard/outboard profiler 54 provides less blocking at the center 44 of the substrate 10 due to the narrowing of the inboard/outboard profiler 54. The sector shape of the inboard/outboard profiler 54 also provides the most blocking at the edge of the substrate 10 due to the broadening of the add inboard/outboard profiler 54.

At the location and position shown in FIGS. 10A and 10B, i.e., with the inboard/outboard profiler 54 located at a position furthest from the sputter target 36 (Γ=0 degrees) and the apex 58 at or near the center 44, the inboard/outboard profiler 54 gradually increases the fraction of blocked flux moving towards the outer radius of the substrate 10, where the outboard shadowing and asymmetry is greatest. Another factor is of note here. At the center 44 of the substrate 10, for the same given width of the inboard/outboard profiler 54, a larger proportion of the substrate 10 is blocked. Conversely, at the outer edge of the substrate 10, for a given width of the inboard/outboard profiler 54, a smaller proportion of the substrate 10 is blocked.

In general, for up to a sector angle ϵ of 180 degrees, the larger the width of the base 56 of the sector, the greater the influence in suppressing the inboard/outboard effect. However, the deposition rate is inversely proportional to the size of the sector. Thus, depending on the deposition system and conditions and the thin film feature manufacturing requirements, a trade-off is made between an acceptable level of asymmetry and a decreased deposition rate.

Next, the film thickness uniformity of the deposited film can be impacted by the use of the inboard/outboard profiler 54. In another embodiment, three masks are used, with two uniformity shapers 60 (FIG. 12 and discussed in detail below) located in neutral positions (at Γ=90 degrees and −90 degrees) and the desired profiler mask located Γ=0 degrees.

The inboard/outboard profiler 54 blocks the same amount of arc of the substrate 10 all along the profiler 54, except at the center 44. Thus, the profiler mask 54 does not affect uniformity thickness of the thin layer and, therefore, is referred to as being "uniformity neutral." The inboard/outboard profiler 54 is useful in addressing the inboard/outboard problem illustrated in FIGS. 7A and 7B, where features 12 further away from the center 44 of the substrate 10 have more inboard/outboard asymmetry. Thus, more blockage of the substrate 10 at its edge is desirable, whereas less blockage at the middle and center 44 of the substrate 10 is desirable. This desired blockage is accomplished by the tapering of the wedge-shaped inboard/outboard profiler 54.

Figure 12:
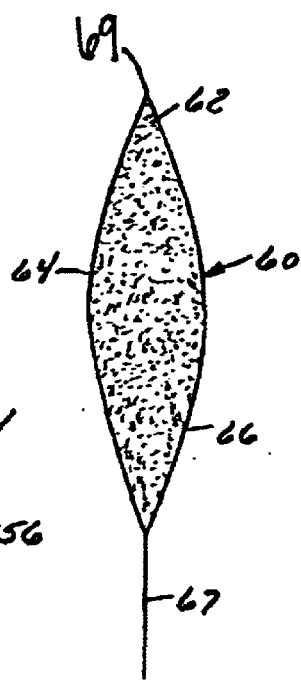
FIG. 12 is a front schematic diagram of a uniformity shaper.

FIG. 12 illustrates a uniformity shaper 60, which has a tapered, upper portion 62, a middle, protruding portion 64, and a tapered, lower portion 66. A holder 67 extends from the lower portion 66 such that it can retain the uniformity shaper 60 in a desired location. In a preferred embodiment, the upper portion 62 and preferably an apex 69 defined by the upper edge of the upper portion 62 is positioned at or near the center 44 of the substrate 10. At the center 44 of the substrate 10 for a given sector of the substrate 10, a greater proportion of the substrate 10 is blocked. Thus, the uniformity shaper 60 is tapered at its upper portion 62 to provide less blockage at the center 44. Due to divergence of the deposition plume 38 more material is deposited at the middle of the substrate 10 than it is at the edge of the substrate 10. More blockage is provided by the middle, protruding portion 64 of the uniformity shaper 60. The tapered, lower portion 66 and preferably the opposed apex is positioned at or near an outer edge of the substrate 10. Notably, the deposition plume 38 reaching the outer edge of the substrate 10 is less dense than that reaching the middle of the substrate 10. Thus, less material is deposited at the outer edge of the substrate 10, and therefore less blockage is desirable. Tapered, lower portion 64 provides this.

Figure 13:
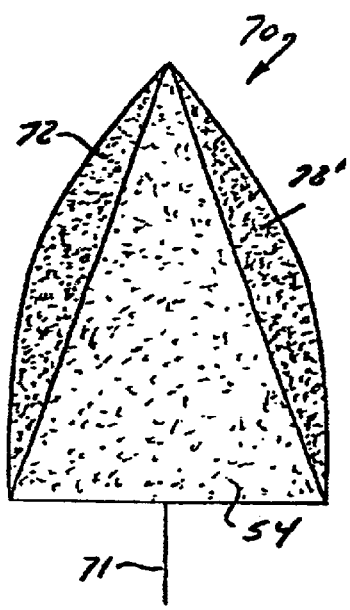
FIG. 13 is a front schematic diagram of a combination shaper that includes the inboard/outboard profiler of FIG. 11 and the uniformity shaper of FIG. 12.

A second preferred embodiment of the profiler mask 52 is referred to herein as a combination shaper 70, which is shown in FIG. 13. The combination shaper 70 includes inboard/outboard profiler 54 and a holder 71. In a preferred embodiment of the combination shaper 70, the inboard/outboard profiler 54 also includes halves 72 and 72' of a standard uniformity shaper 60 that preferably are located on either side of the inboard/outboard profiler 54. An advantage of including the halves 72 and 72' with the inboard/outboard profiler 54, is that width is added to the inboard/outboard profiler 54 to an area where blocking for inboard/outboard effect is desirable. Each half 72 and 72' can be formed by cutting uniformity shaper 60 along its major axis. Also, each half 72 and 72' can be formed as an individual piece, or the combination shaper 70 can be formed as an integral piece. Furthermore, each half 72 can be separable from the inboard/outboard profiler 54, although it is preferred that the halves 72 are not separable because this reduces the number of parts that must be cleaned. Where sandblasting is used to clean, it can alter the shape of the part being cleaned slightly. Thus, if more than one part is cleaned, then there is a higher chance that shapes will be altered and require compensation. In addition, locating one part on a substrate 10 is more easily accomplished than locating multiple parts. In another preferred embodiment of the combination shaper 70, only a single half 72 or 72' of a uniformity shaper 60 is used on one side of the inboard/outboard profiler 54.

Figure 14:
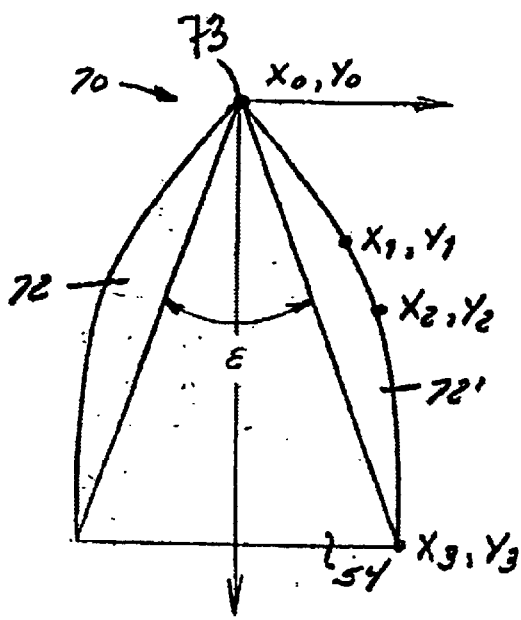
FIG. 14 is a front schematic diagram of the combination shaper of FIG. 13, showing various dimensions thereof.

The combination shaper 70 of FIG. 13 can be defined parametrically for rotational deposition processes as follows:

$$X = R \cos[\pi(1-T_m(R)/T(R)) + \epsilon/2] \qquad \text{Equation 1}$$

$$Y = R \sin[\pi(1-T_m(R)/T(R)) + \epsilon/2] \qquad \text{Equation 2}$$

Where Y is the tilt direction of the substrate fixture, and X is the direction orthogonal to Y. In addition, R is the radius with respect to the center 44 of the substrate 10; ϵ is the chosen sector angle of the inboard/outboard profiler 54 in the combination shaper 70; T(R) is the deposition thickness distribution as a function of radius R of substrate 10 without any profiler mask, and $T_m(R)$ is a minimum thickness value at the edge of the substrate 10 in this distribution. These parameters are illustrated in FIG. 14. For the case at the edge of the substrate 10 (e.g., wafer), $T_m(R)$ is approximately equal to T(R) and thus the $\epsilon/2$ term remains. Notably, the exact profiler shape may be determined according to alternate methods; for example, the shape may be determined empirically.

Referring still to FIG. 14, at position $X_0$, $Y_0$ on the combination shaper 70, the combination shaper 70 comes to an apex 73. Moving from position $X_0$, $Y_0$ to, e.g., position $X_1$, $Y_1$, combination shaper 70 has a greater width than it is at $X_0$, $Y_0$. At $X_2$, $Y_2$, the width of the combination shaper 70 reaches its maximum width. The combination shaper 70 then narrows in width to a position $X_3$, $Y_3$. As a result, when positioned as shown in FIGS. 10A and 10B, both uniformity and profile symmetry are realized with one combination shaper 70.

The size of the inboard/outboard profiler 54 in the combination shaper 70 is determined based on incidence angle at the substrate 10, i.e., substrate tilt angle, and the target flux distribution. Some typical distributions of the target flux are shown in FIGS. 15A and 15B. FIG. 15A shows three common types of flux distributions with the maximum emission angle in line with an axis of the sputter target 36. FIG. 15B shows a flux distribution with the maximum emission at an angle relative to an axis of the sputter target 36. The angle of this flux direction depends on the target material, the energy, and the angle of the incidence ions, as well as other details of the target sputtering process. In FIGS. 15A and 15B, as is appreciated in the art, the shape of flux distribution can be characterized as having a circular cross-section (cosine) 102 and 108, a "sharper" cross-section (over-cosine) 100 (with major axis "m") and 110, and a "flatter" cross-section (under-cosine) 104 and 106. Importantly, depending on how the flux distribution is shaped, a profiler mask having a shape that accounts for differences in the shape of the flux distribution will be required. For example, for an over-cosine deposition flux, there is less uniformity and therefore the uniformity shaper 60 shown in FIG. 12 and the combination shaper 70 shown in FIG. 13 would have broad mid-sections. Factors that contribute to variations in the target flux distribution are materials, ion beam angle (trajectory of ions reaching target-plume divergence), target tilt, deposition plume parameters, target topography, and target to substrate distance.

Location of the profiler mask 52 also affects deposition results across the center 44 of the substrate 10. When the profiler mask 52 is located with its apex at the center 44 of the substrate 10 and there is a normal angle of deposition, deposition flux 38 does not reach the center 44 because it is always blocked by the profiler mask 52. The lack of deposition flux reaching the substrate 10 can create a hole or depression at the center 44.

Figure 16B:
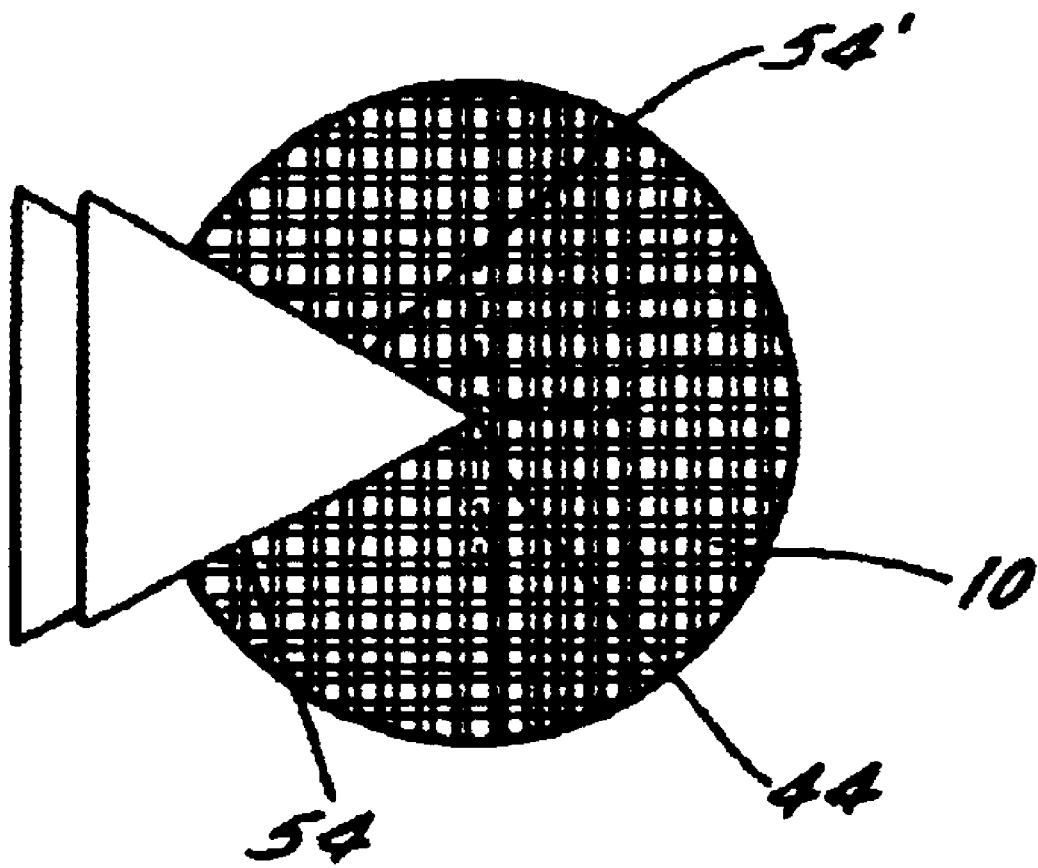
FIG. 16B is a schematic top plan view illustrating the positioning of the profiler mask, including the position of the profiler mask corresponding to the profile of FIG. 16A.

Providing a non-normal angle of deposition permits the deposition flux to reach the center 44 by allowing the deposition plume 38 to go underneath the profiler mask 52. When the profiler mask 52 is positioned radially outwardly from center 44, this can cause formation of a hill at the center 44. An example of a film thickness profile obtained from the profiler mask 70 of FIG. 13 that has been positioned too far away from the center 44 is shown in FIG. 16A, where deposition profile data obtained along axis "A" in FIG. 9 is plotted. FIG. 16B schematically shows a profiler located in an experimental location (producing the results shown in FIG. 16A) and, in phantom, located in an optimum location. In the experimental location, the apex 58 of the inboard/outboard profiler 54 is short of the center 44 of the substrate 10, whereas in the optimum location, the apex 58 is located at the center 44.

The peak in the middle of FIG. 16A resulted from the absence of blocking the center 44 of the substrate 10, thereby exposing the center 44 to the deposition plume 38 more than the rest of the substrate 10 which is blocked at least part of the time. Halves 72 and 72' located on either side of the inboard/outboard profiler 54 improve uniformity, yet FIG. 16A illustrates a gradual dip on both sides of the peak, indicating uniformity can be improved. This is achieved empirically using differently dimensioned uniformity shapers 60. For instance, reducing the width of halves 72 and 72' along their length.

Furthermore, although the film thickness profile shown in FIG. 16A was obtained by using the combination shaper 70 of FIG. 13, the profile shown is mainly an effect of the halves 72 and 72' of the uniformity shaper 60. Recall that the wedge-shaped inboard/outboard profiler 54 of combination shaper 70 is substantially uniformity neutral because it blocks the same amount of arc of the substrate 10 all along the length of the combination shaper 70. Adding the wedge-shaped inboard/outboard profiler 54 of combination shaper 70 essentially shifts only the overall thickness obtained. That is, the same basic profile shown in FIG. 16A would result if a uniformity shaper 60 alone were used. The wedge-shaped inboard/outboard profiler 54 incorporates the halves 72 and 72' so as to maintain the same uniformity benefits as with using a uniformity shaper 60 alone.

The halves 72 and 72' can be optimized to obtain a flat line (representing a uniform film thickness) by properly positioning the halves 72 and 72' and by properly shaping the protrusions of the halves 72 and 72', as suggested previously.

As described above, the location of the profiler mask 52 affects the center 44 of the substrate 10. One way to minimize or eliminate any negative effect of locating the profiler mask 52 is to locate the profiler mask 52 very accurately both radially and in spacing from the substrate 10 to prevent either complete blockage or complete exposure of the center 44. Complete blockage and exposure are undesirable because devices fabricated from features 12 in the center 44 potentially would be unusable.

In another preferred embodiment, the features 12 at the center 44 are intentionally discarded. This allows for more flexibility in the location of the profiler mask 52 and often will not have a large impact on yield. In this instance, the center 44 is referred to as a "center exclusion zone." Features 12 from this zone are discarded, and their film thickness is preferably not included in any uniformity measurement.

Figure 17:
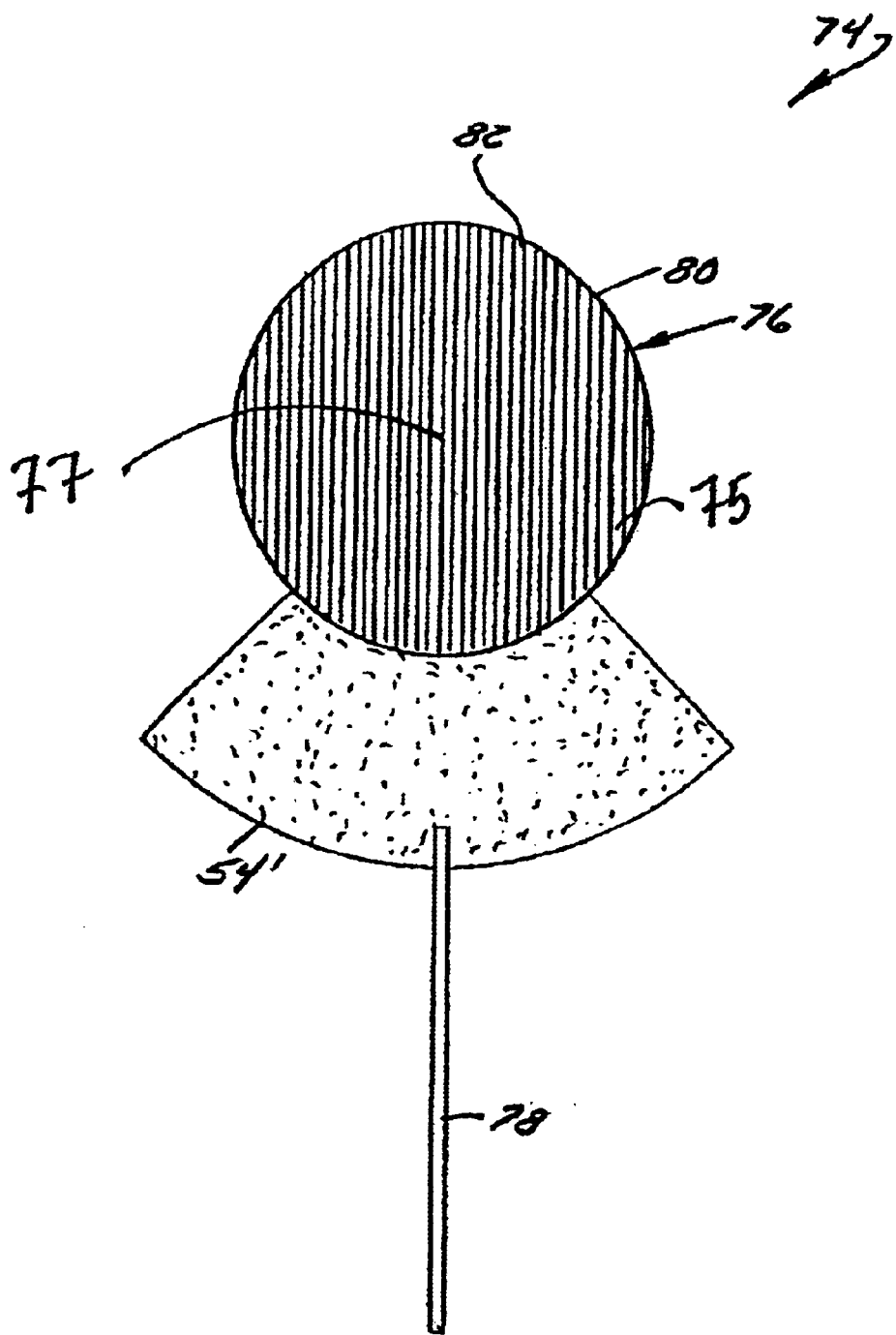
FIG. 17 is a front schematic diagram of a screen profiler mask.
Figure 18:
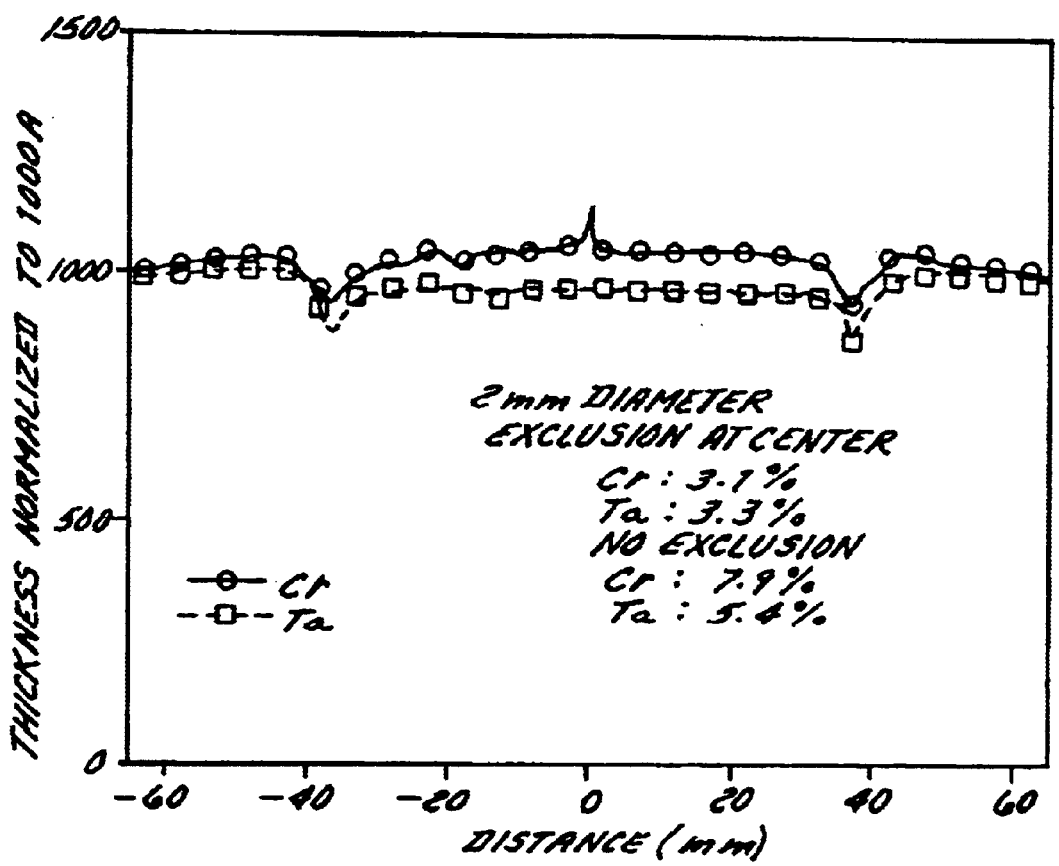
FIG. 18 is a graph illustrating a deposition profile generated with the screen profiler mask of FIG. 17.

FIG. 17 shows a third preferred embodiment of a profiler mask 52, which is referred to herein as a screen profiler mask 74, two alternatives of which are herein described. Initially described is a screen 76 of the screen profiler mask 74. Screen 76 has open features 75 that preferably are located in a central zone 77 of the screen profiler mask 74. Preferably, the screen 76 is located such that open features 75 cover the center 44 of the substrate 10 so as to better control the degree of shading of the center 44 of the substrate 10. The open features 75 of the screen 76 decrease the deposition rate at the center 44. Therefore, the screen 76 advantageously maintains desirable film thickness uniformity across the substrate 10 by partially blocking the deposition plume 38, thereby reducing the peak at the center 44 of the substrate 10, as is illustrated in the graph of FIG. 18.

The screen mask 74 (or screen 76 of the combination screen profiler mask 74) preferably includes a frame 80 and elements 82 that are positioned in such a manner as to avoid creating asymmetric shadowing of the features 12 on the substrate 10.

The elements 82 of the screen 76 may be arranged, for example, in a radial orientation as an array of radial strips 82 or wires 82 mounted on the frame 80, which preferably is a circular frame 80, such that the elements 82 are analogous to spokes on a wheel, or a sector of such a circular frame 80. In this arrangement, when the combination screen mask 74 is used, the elements 82 are preferably located such that they are not exactly over the center 44 of the substrate 10. The radial design is optimum for minimizing shadowing of tangentially aligned features 12, which are, as explained is described above in reference to FIG. 9, mainly suffering from inboard-outboard asymmetry.

In one embodiment, the screen profiler mask 74 is a full screen with no solid portion 54', i.e., solid portion 54' shown in FIG. 17 is a screen as well. The shape of the screen 74 and density of the elements 82 forming the screen 74 can be adjusted to provide uniformity of deposition and block the flux towards the substrate 10 according to the same considerations given to the solid profiler mask 52. However, a screen profiler mask 74 formed exclusively of a screen is typically not as effective as a solid profiler mask 52 in blocking deposition on the substrate 10 in the region where deposition is most asymmetric.

In another embodiment, the screen profiler mask 74 is a combination of a solid sector, such as an inboard/outboard profiler 54', and a screen 74, as is shown schematically in FIG. 17. The screen profiler mask 74 need not be positioned as accurately as the profiler masks 54 or 70, however, the center 47 of screen 76 is preferably axially aligned with the axis of rotation of the substrate 10. The combination screen mask 74 is nearly as effective as a solid profiler mask 52 for controlling inboard-outboard symmetry, because inboard-outboard symmetry is the biggest problem in an outer zone of the substrate 10 (see FIG. 8). Additionally, the combination screen profiler mask 74 is as effective as a full screen mask 74 in controlling the shading of the deposition on the center 44 of the substrate 10. The design of the screen 74 of the combination screen mask 74 provides sufficient reduction of the deposition rate in the center 44 of the substrate 10, which is covered by the screen 76, to effectively equalize the deposition rate at the center 44 with the rate at the edge of the substrate 10. This is suppressed by the inboard/outboard profiler 54 of the combination screen mask 74.

In addition, the combination screen profiler mask 74 can also include halves 72 and 72' added to sides of the inboard/outboard profiler 54' to provide uniformity shaping as described previously. A shaper holder 78 extends from an end of the inboard/outboard profiler 54 that is opposite the end where the screen 76 is located.

To control the deposition rate across the substrate 10, the open area density of the screen 76 may be adjusted in several ways. For example, the thickness of the elements 82 can be increased or decreased, either uniformly or non-uniformly, while holding the number of elements 82 the same. Alternatively, the elements 82 may be kept at the same dimensions, and the number of elements 82 may be increased or decreased. Generally, with greater thickness and number of elements 82, the lower the deposition rate.

In a particularly preferred embodiment, the frame 80 is about 0.02 inches thick and about 0.02 inches wide and the elements are wires having a diameter of about 0.02 inches, with the distance between the wires being about 0.08 inches.

Additionally, in the inboard/outboard profiler 54', it is particularly preferred to have a sector of about 90 degrees of an element having a 6.0 inch dimension, e.g., diameter. The preferred diameter of screen 76 is 3.0 inches.

Features 12 on the substrate 10 located within the shadow of a circular screen frame 80 may be shadowed during the entire period of substrate rotation. To minimize this effect, the frame 80 of the screen 76 is preferably very thin. Other ways to reduce such a problem would be to connect the elements 82 by a manner other than a circular frame or by slightly offsetting the center of the frame 82 from the center 44 of the substrate 10. However, any such measure is preferably evaluated also in terms of its affect on the deposited film thickness uniformity. Narrow width screen elements 82 preferably are used in the center of the screen 76 to avoid blocking deposition on the center 44 of the substrate 10 by any individual screen element 82. This is particularly important for the "radial" arrangement described above, where the elements 82 converge in the central hub.

The screen 76 is held above the substrate 10 and parallel to the surface of the substrate 10. For the screen 76 shown in FIG. 17, the elements 82 also should be aligned with the axis "D" of one substrate shown, for example, in FIG. 10A. The screen profiler mask 74 can also be non-parallel to the upper surface of the substrate 10. In a simple radial design, the elements 82 converge at a center "hub," creating an area of complete blockage inside the screen 76. Also, the overlap of these elements 82, each of which has some appreciable thickness, creates a "lump" in this area that is closer to the substrate 10 than the rest of the screen profiler mask 74, enhancing the blocking effect. To avoid permanent blockage of the substrate center 44 by this hub, the screen profiler mask 74 is preferably located such that the hub is slightly displaced off-center. Although this means that the positioning of the screen profiler mask 74 is important to the deposition rate in the center 44, in this case, as compared to that of the solid profiler mask 54 or 70, the effect is much less dependent on the exact positioning, since the hub may be located anywhere outside of its influence on the center 44, and the deposition rate in the center 44 will still be shaded by about the same amount.

In a preferred embodiment, the combination screen mask 74 is quite uniform in open area density. This results in the deposition rate in the center 44 being relatively insensitive to position of the screen profiler mask 74. Depending on the direction of incidence of a collimated sputtered flux, the orientation of these parallel mask elements 82 can be optimized to minimize any shadowing of the features 12. The optimum orientation to minimize shadowing of the features 12 is in the plane of most oblique incidence. For the deposition geometry shown in FIGS. 5A and 5B, this plane is defined by the tilt of the substrate 10. In this case, the elements 82 are preferably arranged along the tilt direction. This orientation is shown in FIGS. 10A and 10B.

The advantages of one screen design verses another depend on the deposition conditions. Other types of screen designs, such as a cross-hatch ("window screen") design may also be used. Additionally, a modified radial design that avoids a hub in the center, e.g., by adding an "eyelet" ring, can be used or a radial design in which the hub center is shifted with respect to the rest of the screen 76 are also contemplated.

Selection of the size of the screened area 76 versus the size of the solid area 54' of a combination screen profiler mask 74, such as shown in FIG. 17, is governed by several factors. For example, the screen 76 is preferably large enough in diameter that the deposition rate on the center 44 the substrate 10 is only influenced by the array of screen elements 82 (not including the screen frame 80). The screened area 76 should not be so large, however, as to extend toward the edge of the substrate 10 where the inboard-outboard symmetry is not acceptable. The inboard/outboard profiler 54' of the screen profiler mask 74, by completely blocking deposition at the most unfavorable angles, provides the best inboard-outboard symmetry improvement where it is required. Another factor is that control of the deposition thickness uniformity profile is most easily and effectively obtained by varying the shape of the inboard/outboard profiler 54 of the screen profiler mask 74. Thus, the screen 76 preferably is confined to a central area of substantially uniform deposition thickness. Therefore, the screen 76 may be slightly larger or considerably smaller than shown in FIG. 17.

FIG. 18 shows a graph of deposition thickness distribution obtained with the combination screen profiler mask 74 of FIG. 17. In the center of the graph, there is a peak in film thickness. The relative height of this, however, is small. There are also dips in the deposited thickness at about 40 mm and −40 mm from θ that are due to the shadow of the screen frame 80. Both the peak and dip regions are confined to relatively small areas of the entire substrate 10. This means that the statistical uniformity across the substrate 10 is not much disturbed by these and any yield loss due to these artifacts is minimal. In particular, the center exclusion zone on a substrate 10 deposited with a screen profiler mask 74 is advantageously small. When using the screen profiler mask 74, a center exclusion zone of only 2 mm is required. In contrast, when using a inboard/outboard profiler 54, the center exclusion can be as high as 15 mm.

Overall, use of a screen profiler mask 74 results in better film deposition uniformity than is obtained with the combination shaper 70 of FIG. 13 due to positioning difficulty with the combination shaper 70.

It should be noted that all of the above-described embodiments of profiler masks 52 are symmetric with respect to a bisecting centerline. However, the profiler mask 52 may be modified such that the same arc sector of the substrate 10 is blocked on each radius from the center of the rotation of the substrate 10. For example, as is noted above, for a combination shaper 70, a single half 72 or 72' of a uniformity shaper 60 can be place on only a single side of the combination shaper 70.

Figure 19:
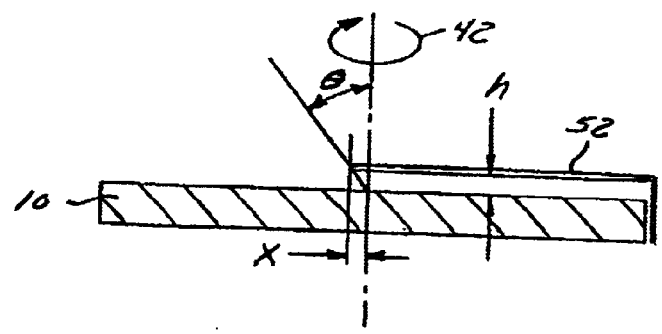
FIG. 19 is a schematic diagram showing in more detail the positioning of the profiler mask.

For positioning of a profiler mask 52 other than a screen profiler mask 74, attention is now directed to FIG. 19, which shows a more detailed view of the profiler mask 52 over the substrate 10. In FIG. 19, the profiler mask 52 is positioned a distance 'x' beyond the center 44 of the substrate 10. This is because the substrate 10 is positioned at an off-normal deposition angle and, hence, the depositing material comes in at an angle 'θ'. The relationship between the distance 'h' that the profiler mask 52 is placed above the substrate 10, the deposition angle 'θ', and the offset of the profiler mask 52 with respect to the center 44 of the substrate 10 'x' is shown in Equation 3.

$$x = h \tan(\theta) \quad \text{Equation 3}$$

Typical values for h and θ are 2–5 mm and 20–30 degrees, respectively. This gives values of x of 0.7–2.9 mm. If the screen profiler mask 74 were not used, the profiler mask 54 or 70 would have to be adjusted with an accuracy of less than 0.1 mm. Notably, computer controlled actuators are preferably used for the profiler mask to ensure accurate placement of the profiler mask 54 or 70 and to move the profiler mask 54 or 70 for different materials.

Figure 20:
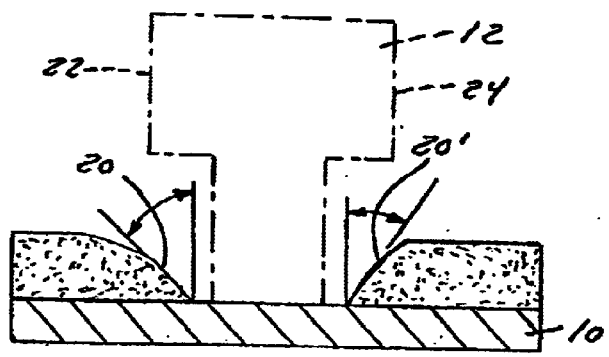
FIG. 20 is a schematic diagram showing experimental results of the effect of using a profiler mask, showing generally symmetric sidewalls.

FIG. 20 shows a profile obtained for features 12 at the edge of a six-inch wafer 10 using a properly positioned mask 52 of the preferred embodiment. Experimental results obtained in the absence of a profiler mask and with various embodiments of the profiler mask 52, including 60 degrees, 90 degrees, 120 degrees inboard/outboard profilers 54, and a combination screen profiler mask 74 with a 120 degrees inboard/outboard profiler 54 and a screen 76 are shown in Table 1, which lists values for the angles of the sidewalls obtained for the inboard side 22 and outboard side 24 of the feature 12 as a function of the sector mask angle ε. The data clearly show the positive effect that the profiler mask 54 and 70 has on decreasing the asymmetry of the inboard/outboard effect. For example, using no profiler or a small profiler mask 54 of 60 degrees had little effect on the symmetry, while the 120 degree profiler mask 54 had the strongest influence.

TABLE 1

| Sector Angle of Profiler | Inboard Angle | Outboard Angle | Difference |
|---|---|---|---|
| No Profiler | 39.1 | 23 | 16.1 |
| 60 | 47.7 | 31.3 | 16.4 |
| 90 | 48.7 | 33.6 | 15.1 |
| 120 | 50.3 | 43.2 | 7.1 |
| 120 + screen | 47.9 | 41.8 | 6.1 |

Using a preferred embodiment of the invention when depositing thin films on lift-off features, a generally symmetric profile of deposited material result, as is illustrated in FIG. 4. Additionally, a preferred embodiment of the invention can be used during deposition of thin-layer films on step features 112 (FIG. 2B) to produce a generally symmetric deposition profile on step features. In addition, the invention can be used to deposit thin-layer films on trench features 212 (FIG. 2C) to controls the amount of material deposited on the inboard side 222 and the outboard side 224 of the trench feature 212 such that a generally symmetric deposition profile results.

Automatic control features of deposition mask positioning in different dimensions, as described for a flux regulator in U.S. Pat. Nos. 6,238,531; 6,197,164; and 6,086,727, to Pinarbasi, may be correspondingly utilized in this invention.

In addition, a profiler mask 52 can be moved or indexed across a surface of the substrate 10 during the deposition, or between partial deposition steps, to achieve optimum symmetry between the sidewalls. In a preferred embodiment, this moving or indexing is accomplished with active position adjustment. This is another way, for example, of avoiding the center problem, as the profiler mask 52 can be moved from a position blocking the center 44 of the substrate 10 to a position that does not block the center 44 during the deposition process.

Figure 21A:
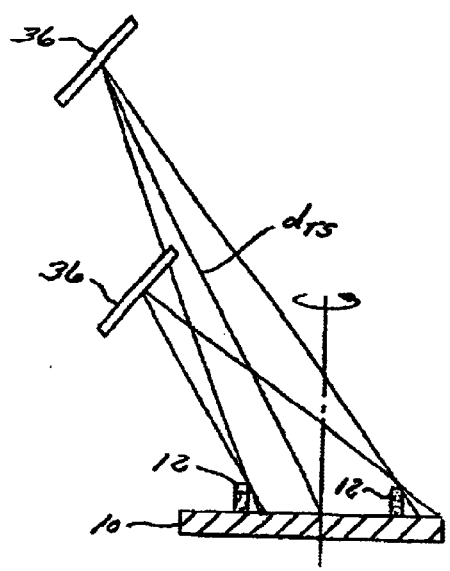
FIG. 21A is a schematic diagram depicting the effect of increasing the target to substrate distance.
Figure 21B:
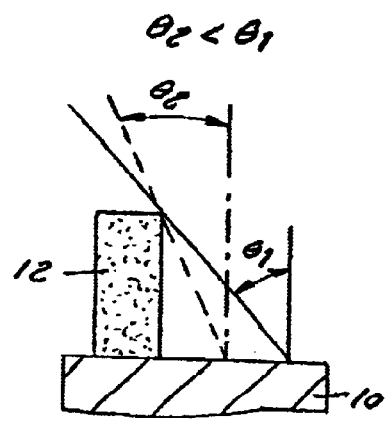
FIG. 21B is a detailed view of a portion of FIG. 21A.

Another factor that controls the shadowing effect is the sputter target to substrate distance "$d_{TS}$," shown in FIGS. 21A and 21B. Increasing this distance decreases the difference between the inboard deposition and the outboard deposition angles and thereby decreases the asymmetry, as is illustrated in FIGS. 21A and 21B. In particular, outboard deposition angles $\theta_1$ and $\theta_2$ are depicted for two cases, a first target 36 to substrate 10 distance ($d_{TS}$) and a second target 36 to substrate distance, respectively, where the second distance is larger than the first distance, i.e., $\theta_2 < \theta_1$. For a given sputter target to substrate distance $d_{TS1}$, if the asymmetry is acceptable up to a diameter $D_2$ (FIG. 8), increasing the target to substrate distance to $d_{TS2}$ would increase the acceptable diameter to a new distance $D_3$ by the following relationship:

$$D_3 = (D_{TS2} \times D_2)/D_{TS1} \quad \text{Equation 4}$$

(Equation 4 assumes the target flux source size is not critical or is scaled up proportionately with the distance.)

An important corollary of this is that for a certain amount of acceptable asymmetry (dependent on application), the larger $d_{TS}$ is, the smaller is the necessary size of the inboard/outboard profiler 54.

Many changes and modifications may be made to the invention without departing from the spirit thereof. For example, in addition to IBD, which has been presented as a matter of convenience for illustrative purposes, other deposition apparatus and techniques may utilize the preferred embodiments to achieve greater deposition profile symmetry. These include, but are not limited to, physical vapor deposition, sputtering, evaporation and laser ablation. These may also be used for these types of processes and may incorporate substrate tilting and rotation features of the invention. The scope of some of these changes is discussed above. The scope of other changes will become apparent from the appended claims.

We claim:

1. A deposition system comprising:
   (A) a substrate holder supporting a substrate defining at least one topographical feature;
   (B) a deposition flux directed toward the substrate; and
   (C) a first profiler mask positioned between the deposition flux and the substrate, wherein the first profiler mask is shaped so as to reduce inboard/outboard asymmetry in a deposition profile associated with the feature.

2. The deposition system of claim 1, wherein the profiler mask has a shape of a sector of a circle.

3. The deposition system of claim 2, wherein the sector shape has an angle between about 10 degrees to about 180 degrees.

4. The deposition system of claim 1, wherein the profiler mask includes a solid portion and an open portion.

5. The deposition system of claim 4, wherein the open portion of the profiler mask is comprised of:
   (A) a frame; and
   (B) elements extending from the frame.

6. The deposition system of claim 5, wherein the elements are arranged in parallel.

7. The deposition system of claim 6, wherein the elements are equally spaced apart.

8. The deposition system of claim 7, wherein the elements have a thickness of about 0.02 inches and a width of about 0.02 inches.

9. The deposition system of claim 5, wherein the elements are oriented radially.

10. The deposition system of claim 5, wherein the profiler mask is oriented above the substrate and parallel to an upper surface of the substrate.

11. The deposition system of claim 1, wherein the profiler mask includes a sector-shaped piece and a first protruding piece that is located at a first side of the sector-shaped piece.

12. The deposition system of claim 11, wherein the profiler mask further comprises a second protruding piece that is located at a second side of sector-shaped piece.

13. The deposition system of claim 12, wherein a shape of the profiler mask is defined by the equations:

$$X = R \cos[\pi(1 - T_m(R)/T(R)) + \epsilon/2] \text{ and}$$

$$Y = R \sin[\pi(1 - T_m(R)/T(R)) + \epsilon/2],$$

wherein Y is the tilt direction of the substrate holder, and X is the direction orthogonal to Y; and wherein R is a radius with respect to a center of the substrate, $\epsilon$ is the chosen angle of the sector shaped portion of the profiler mask, T(R) is a deposition thickness distribution without any profiler mask, and $T_m(R)$ is a minimum thickness value in this distribution.

14. The deposition system of claim 1, wherein the profiler mask comprises a uniformity shaper.

15. The deposition system of claim 1, wherein the deposition flux is generated by a source that directs a beam of ions toward a sputter target.

16. The deposition system of claim 15, wherein the profiler mask is located in a region at about a position furthest away from the sputter target, generally parallel to a surface of the substrate.

17. The deposition system of claim 16, wherein the profiler mask defines an apex and said apex is located adjacent to about a center point of the substrate.

18. The deposition system of claim 15, wherein the profiler mask is located in a range of 90 degrees relative to either side of a point furthest away from the sputter target in a plane orthogonal to an axis of rotation of the substrate.

19. The deposition system of claim 15, wherein the profiler mask is located in a region at about a point closest to the sputter target.

20. The deposition system of claim 15, wherein a distance between the sputter target and the substrate is changed so as to decrease inboard/outboard asymmetry.

21. The deposition system of claim 1, further comprising a second profiler mask spaced from the first profiler mask.

22. The deposition system of claim 21, wherein the deposition flux is generated by a source that directs a beam of ions toward a sputter target, and wherein the first and second profiler masks are located 90 degrees and −90 degrees azimuthly relative to either side of a point furthest away from the sputter target.

23. The deposition system of claim 1, wherein the deposition flux is generated via a physical vapor deposition (PVD) process.

24. The deposition system of claim 1, wherein the first profiler mask is moved during a deposition process in response to a predetermined deposition profile.

25. An apparatus to reduce inboard/outboard asymmetry in thin-film profiles, the apparatus comprising a profiler mask that is disposed between a deposition flux directed toward a substrate and the substrate, the profiler mask being shaped so as to block the same amount of arc of the substrate along a length of the mask.

26. The apparatus of claim 25, wherein the profiler mask includes a sector-shaped piece.

27. The apparatus of claim 26, wherein the sector shape ranges in angle from about 10 degrees to about 180 degrees.

28. The apparatus of claim 26, wherein the profiler mask further comprises a first protruding piece that is located at a first side of the sector shaped piece.

29. The apparatus of claim 28, wherein the profiler mask further comprises a second protruding piece that is located at a second side of sector shaped piece.

30. The apparatus of claim 26, wherein a shape of the profiler mask shape is defined by the equations:

$$X = R \cos[\pi(1 - T_m(R)/T(R)) + \epsilon/2] \text{ and}$$

$$Y = R \sin[\pi(1 - T_m(R)/T(R)) + \epsilon/2],$$

wherein Y is the tilt direction of a substrate holder, and X is the direction orthogonal to Y; and wherein R is a radius with respect to a center of the substrate, ε is the chosen angle of the first portion of the mask, T(R) is a deposition thickness distribution without any profiler mask, and $T_m(R)$ is a minimum thickness value in this distribution.

31. The apparatus of claim 25, wherein the profiler mask is composed of a solid portion and an open portion.

32. The apparatus of claim 31, wherein the open portion of the profiler mask is comprised of:

(A) a frame; and (B) elements extending from the frame.

33. The apparatus of claim 32, wherein the elements are oriented radially.

34. The apparatus of claim 32, wherein the elements are oriented parallel to an upper surface of the substrate.

35. The apparatus of claim 31, wherein the elements are arranged in parallel.

36. The apparatus of claim 35, wherein the elements are equally spaced.

37. The deposition system of claim 36, wherein the elements have a thickness of about 0.02 inches and a width of about 0.02 inches.

38. The apparatus of claim 25, wherein the profiler mask comprises a uniformity shaper.

39. A method of controlling deposition asymmetry on sides of features disposed on a substrate, the method comprising:

(A) directing a deposition flux toward the substrate;

(B) tilting the substrate so that the deposition flux impinges on the substrate at a non-normal incident angle; and (C) inserting a first profiler mask between the deposition flux and the substrate to at least partially block the deposition flux so as to reduce inboard/outboard asymmetry.

40. The method of claim 39, wherein the inserting step comprises locating the first profiler mask so as to block the same amount of arc of the substrate along a length of the first profiler mask.

41. The method of claim 39, wherein the inserting step comprises blocking a differing amount of arc of the substrate along a length of the first profiler mask.

42. The method of claim 39, further comprising generating the deposition flux by directing a beam of ions toward a target of a material to be sputtered.

43. The method of claim 42, wherein the inserting step includes inserting the first profiler mask in a region at about a position furthest away from the sputter target.

44. The method of claim 42, wherein the inserting step comprises inserting the first profiler mask in a range of 90 degrees relative to either side of a point furthest away from the sputter target.

45. The method of claim 42, wherein the inserting step comprises inserting the first profiler mask in a region at about a position closest to the sputter target.

46. The method of claim 42, further comprising the step of inserting a second profiler mask between the sputter target and the substrate to at least partially block deposition of the thin film on the substrate.

47. The method of claim 46, wherein the first and second profiler masks are inserted 90 degrees and −90 degrees, respectively, relative to either side of a point furthest away from the sputter target.

48. The method of claim 46, wherein the first profiler mask is inserted in a region that is furthest from the sputter target and the second profiler mask is inserted in a region that is closest to the sputter target.

49. The method of claim 39, wherein the first profiler mask is sector shape defining an apex, and wherein the inserting step includes locating the first profiler mask so that the apex is generally adjacent to a center of the substrate.

50. The method of claim 39, further comprising the step of moving the profiler mask during the depositing step.

51. The method of claim 50, wherein the profiler mask is positioned to block a center of the substrate during a first portion of time of the depositing step and the moving step includes locating the profiler mask at a position offset from the center during a second portion of time of the depositing step.

* * * * *

UNITED STATES PATENT AND TRADEMARK OFFICE
CERTIFICATE OF CORRECTION

PATENT NO. : 6,716,322 B1
DATED : April 6, 2004
INVENTOR(S) : Hari Hegde et al.

It is certified that error appears in the above-identified patent and that said Letters Patent is hereby corrected as shown below:

<u>Title page,</u>
Item [12], Inventor's name should read -- Hegde et al. -- not "Hedge et al."
Item [75], Inventor's name should read -- Hari Hegde -- not "Hari Hedge"

Signed and Sealed this

Twenty-seventh Day of July, 2004

JON W. DUDAS
*Acting Director of the United States Patent and Trademark Office*